(12) United States Patent
Wojtczak et al.

(10) Patent No.: US 6,344,432 B1
(45) Date of Patent: Feb. 5, 2002

(54) FORMULATIONS INCLUDING A 1,3-DICARBONYL COMPOUND CHELATING AGENT AND COPPER CORROSION INHIBITING AGENTS FOR STRIPPING RESIDUES FROM SEMICONDUCTOR SUBSTRATES CONTAINING COPPER STRUCTURES

(75) Inventors: William A. Wojtczak, Santa Clara; Ma. Fatima Seijo, Hayward, both of CA (US); David Bernhard, Dallas, TX (US); Long Nguyen, San Jose, CA (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/732,370

(22) Filed: Dec. 8, 2000

Related U.S. Application Data

(63) Continuation-in-part of application No. 09/331,537, filed on Aug. 20, 1999, now Pat. No. 6,211,126.

(51) Int. Cl.[7] .............................. C11D 9/04; B08B 6/00; C03C 23/00

(52) U.S. Cl. ..................... 510/175; 510/177; 510/178; 134/1.1; 134/1.2; 134/1.3; 134/2

(58) Field of Search ........................... 134/1.2, 1.3, 26, 134/28, 38; 430/331; 438/669; 510/175, 176, 212, 178

(56) References Cited

U.S. PATENT DOCUMENTS

| | | | |
|---|---|---|---|
| 5,630,904 A | * | 5/1997 | Aoyama et al. |
| 6,211,126 B1 | * | 4/2001 | Wojtczak et al. |
| 6,248,704 B1 | * | 6/2001 | Small et al. |

\* cited by examiner

*Primary Examiner*—Yogendra N. Gupta
*Assistant Examiner*—Gregory E. Webb
(74) *Attorney, Agent, or Firm*—Margaret Chappuis; Robert A. McLauchlan

(57) ABSTRACT

A semiconductor wafer cleaning formulation, including 2–98% wt. organic amine, 0–50% wt. water, 0.1–60% wt. 1,3-dicarbonyl compound chelating agent, 0–25% wt. of additional different chelating agent(s), 0.5–40% wt. nitrogen-containing carboxylic acid or an imine, and 2–98% wt polar organic solvent. The formulations are useful to remove residue from wafers following a resist plasma ashing step, such as inorganic residue from semiconductor wafers containing delicate copper interconnecting structures.

14 Claims, 2 Drawing Sheets

FORMULATIONS INCLUDING A 1,3-DICARBONYL COMPOUND CHELATING AGENT AND COPPER CORROSION INHIBITING AGENTS FOR STRIPPING RESIDUES FROM SEMICONDUCTOR SUBSTRATES CONTAINING COPPER STRUCTURES

CROSS-REFERENCE TO RELATED APPLICATIONS

This is a continuation-in-part of U.S. patent application Ser. No. 09/331,537 filed Aug. 20, 1999, U.S. Pat. No. 6,211,126 based on and claiming the priority of International Patent Application No. PCT/US97/23917 filed Dec. 23, 1997 and specifying the United States as a Designated State.

BACKGROUND OF THE INVENTION

1. Field of the Invention

The present invention relates generally to chemical formulations that are useful in semiconductor wafer fabrication and particularly to chemical formulations that are utilized to remove residue from wafers following a resist plasma ashing step. More specifically, the present invention relates to cleaning formulations for removal of inorganic residue from semiconductor wafers containing delicate copper interconnecting structures.

2. Description of the Prior Art

Various chemical formulations are conventionally employed to remove residue and clean wafers following a resist ashing step. Some of these chemical formulations include akaline compositions containing amines and/or tetraalkyl ammonium hydroxides, water and/or other solvents, and chelating agents. Such formulations have associated drawbacks which include unwanted removal of metal or insulator layers and the promotion of corrosion of desirable metal layers, particularly copper or copper alloys features.

Some of such formulations employ corrosion-inhibiting additives to prevent undesirable copper metal corrosion during the cleaning process. However, conventional corrosion-inhibiting additives typically have detrimental effects on the cleaning process because such additives interact with the residue and inhibit dissolution of such residue in the cleaning fluid. Further, conventional additives do not easily rinse off copper surfaces after completion of the cleaning process and their presence results in contamination of the integrated circuits. Contamination of the integrated circuit will disadvantageously increase the electrical resistance of the contaminated areas and cause unpredictable conducting failures within the circuitry.

It is therefore an object of the present invention to provide chemical formulations that effectively remove residue following a resist ashing step.

It is another object to provide wafer cleaning formulations that do not attack and potentially degrade delicate metal structures that are meant to remain on the wafer.

It is yet another object of the present invention to provide a wafer cleaning formulation including an improved corrosion inhibitor for protection of copper structures on the semiconductor substrate, in a compositional form that is easily rinsed off by water or other rinse media after the completion of the residue-removal process, thereby reducing contamination of the integrated circuitry on the wafer substrate.

Other objects and advantages of the invention will become fully apparent from the ensuing disclosure and appended claims.

SUMMARY OF THE INVENTION

The present invention relates to semiconductor wafer cleaning formulations having utility for cleaning of semiconductor wafers, e.g., in post plasma ashing semiconductor fabrication.

In one aspect, the invention relates to a method of removing residue from a wafer following a resist plasma ashing step on such wafer, comprising contacting the wafer with a cleaning formulation, including (i) an organic amine, (ii) water, (iii) a nitrogen-containing carboxylic acid or an imine, (iv) a 1,3-dicarbonyl chelating compound, (v) a polar organic solvent, and optionally (vi) at least one other metal chelating agent.

Another aspect of the invention relates to a wafer cleaning formulation, including (i) an organic amine, (ii) water, (iii) a nitrogen-containing carboxylic acid or an imine, (iv) a 1,3-dicarbonyl chelating compound, (v) a polar organic solvent, and optionally (vi) at least one other metal chelating agent.

In a further aspect, the invention relates to a semiconductor wafer cleaning formulation for use in post plasma ashing semiconductor fabrication, comprising the following components in the percentage by weight (based on the total weight of the formulation) ranges shown:

| | |
|---|---|
| organic amine(s) | 2–98% |
| water | 0–50% |
| 1,3-dicarbonyl compound chelating agent | 0.1–60% |
| additional different chelating agent(s) | 0–25% |
| nitrogen-containing carboxylic acid or imine | 0.5–40% |
| polar organic solvent | 2–98% |
| TOTAL | 100% |

The formulations of the present invention effectively remove inorganic residues, especially metal halide and metal oxide residues, following a plasma ashing step. Such formulations also significantly reduce undesirable corrosion or removal of copper metal structures on the semiconductor wafer during their use.

The formulations of the present invention additionally leave less contamination after the residue-removal process and therefore improve quality of the resulting microelectronic device products.

Other features and advantages of the present invention will be from the ensuing disclosure and appended claims.

DETAILED DESCRIPTION OF THE PREFERRED EMBODIMENTS

Figure 1:
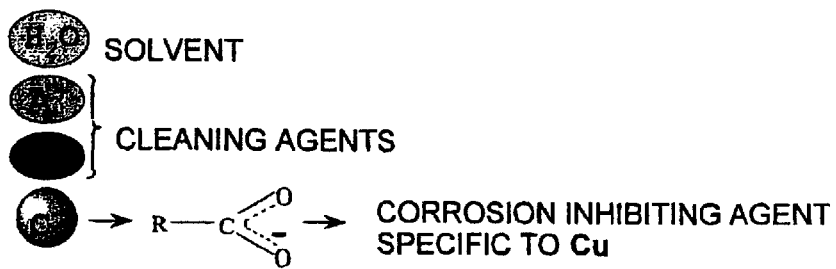
FIG. 1 is a schematic representation of a copper-specific corrosion inhibitor useful in the broad practice of the present invention, which forms a protective layer on the copper metal to prevent corrosion.
Figure 1:
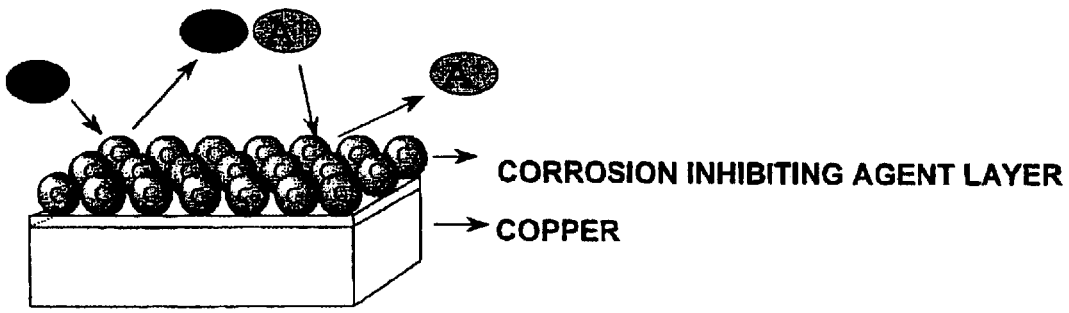

The present invention relates to formulations that are suitable for stripping inorganic wafer residues arising from high-density plasma etching followed by ashing with oxygen-containing plasmas.

The formulations advantageously contain 1,3-dicarbonyl compounds and/or other metal chelating agents, nitrogen-containing carboxyl acids or imines, amines, and water or other solvent as primary ingredients.

The preferred formulations comprise the following components in the percentage by weight (based on the total weight of the formulation) ranges shown:

| | |
|---|---|
| organic amine(s) | 2–98% |
| water | 0–50% |
| 1,3-dicarbonyl compound chelating agent | 0.1–60% |
| additional different chelating agent(s) | 0–25% |
| nitrogen-containing carboxylic acid or imine | 0.5–40% |
| polar organic solvent | 2–98% |
| TOTAL | 100% |

The components of the formulation as described above can be of any suitable type or species, as will be appreciated by those of ordinary skill in the art. Specific illustrative and preferred formulation components for each of the ingredients of the formulation are described below, with specific components being identified with their preferred wt. % concentrations in the formulation, on the total weight basis specified above.

Preferred amines include:

| | |
|---|---|
| pentamethyldiethylenetriamine (PMDETA) | 5–95% |
| triethanolamine (TEA) | 5–95% |

Other amines that are highly advantageous include:
monoethanolamine
diglycolamine
diazabicyclo (2.2.2) octane
diethylenetriamine
3,3'-iminobis (N,N-dimethylpropylamine)
N-methylimidazole
tetraethylenepentamine
triethylenetetramine
trimethoxyethoxyethylamine
diethanolamine
methyldiethanolamine
tetramethylhexanediamine
N,N-diethylethanolamine Specific preferred 1,3-dicarbonyl compound chelating agents include:

| | |
|---|---|
| 2,4-pentanedione | 2–90% |
| N,N-Dimethylacetoacetamide | 2–90% |
| methyl acetoacetate | 15–70% |
| dimethylmalonate | 10–48.3% |

Other 1,3-dicarbonyl compounds that are highly advantageous include:
N-methylacetoacetamide
acetoacetamide
malonamide The preferred nitrogen-containing carboxylic acids or imines include:

| | |
|---|---|
| iminodiacetic acid | 0.5–2.5% |
| glycine | 0.5–2.5% |
| nitrilotriacetic acid | 0.5–2.5% |
| 1,1,3,3-tetramethylguanidine | 0.5–2.5% |

Other nitrogen-containing carboxylic acids or imines that are highly advantageous include:
$CH_3C(=NCH_2CH_2OH)CH_2C(O)N(CH_3)2$
$CH_3C(=NCH_2CH_2OCH_2CH_2OH)CH_2C(O)N(CH_3)_2$
$CH_3C(=NH)CH_2C(O)CH_3$
$(CH_3CH_2)_2NC(=NH)N(CH_3CH_2)_2$
$HOOCCH_2N(CH_3)_2$
$HOOCCH_2N(CH_3)CH_2COOH$ The preferred solvents include:

| | |
|---|---|
| water | 0–50% |
| ethylene glycol | 0–74% |
| N-methylpyrrolidone (NMP) | 0–49% |
| sulfolane | 0–10% |

Preferred secondary or alternative chelating agents optionally utilized in some of the formulations of the invention include:

| | |
|---|---|
| ammonium pyrrolidinedithiocarbamate | 0–25% |
| ammonium carbamate | 0–15% |
| ammonium oxalate | 0–15% |
| ammonium thiocyanate | 0–15% |
| ammonium thiosulfate | 0–15% |
| trifluoroacetic acid | 0–12% |

The utilization of formulations containing 1,3-dicarbonyl compounds and/or other metal-chelating agents in combination with amines and a solvent enables unique improvements of the art to be realized. The inventive formulations provide better stripping performance and less corrosivity than conventional wafer stripping formulations containing catechol, amine, and solvent.

Figure 2:
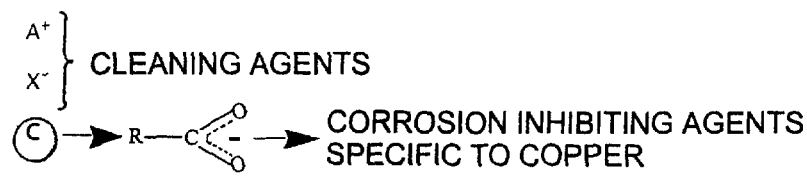
FIG. 2 is a schematic representation of the copper-specific corrosion inhibitor being rinsed away from the copper surface by deionized water.
Figure 2:
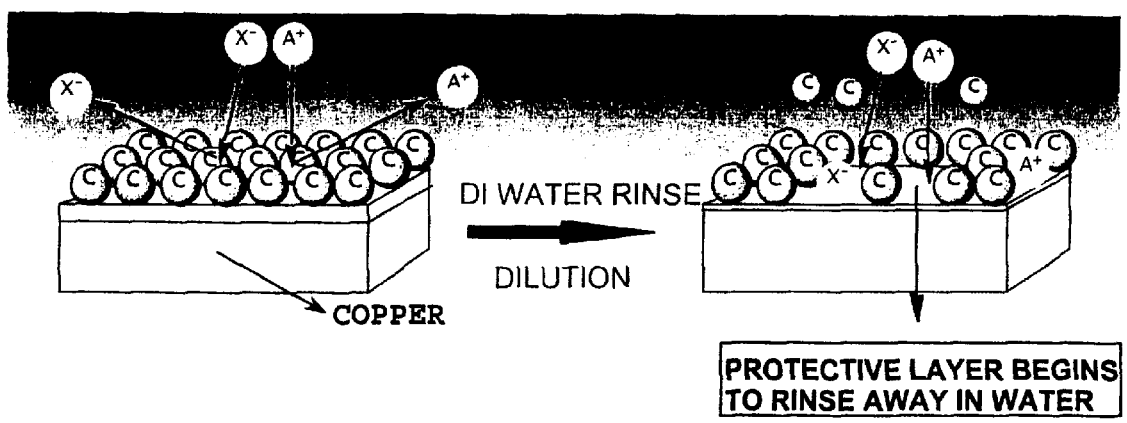

The addition of nitrogen-containing carboxylic acids or imines is another advantageous improvement of the present invention. The nitrogen-containing carboxylic acids or imines contain functional groups that are specifically attracted to free copper atoms. As shown by FIG. 1, the copper-specific corrosion inhibiting agent C, which contacts the copper surface during the residue-removal process, will attach to the copper surface and form a protective layer to prevent the copper surface being corroded by cleaning agents $A^+$ and $X^-$. Moreover, as shown by FIG. 2, such copper-specific corrosion-inhibiting agent C can be easily rinsed off by deionized water or other rinse media and therefore leaves very little contamination on the copper surface after the cleaning operation is completed.

The formulations of the invention may include a wide variety of solvents, organic amines, chelating agents, and nitrogen-containing carboxylic acids or imines, other than those specifically exemplified. Particular 1,3-dicarbonyl compounds and related compounds of suitable character include those of the formula:

wherein R is either a hydrogen atom or an aliphatic group, e.g., $C_1$–$C_8$ alkyl, aryl, alkenyl, etc., X and Y are the same as or different from one another, and are functional groups containing multiply-bonded moieties with electron-withdrawing properties, as for example $CONH_2$, CONHR', CONR'R', CN, $NO_2$, SOR', or $SO_2Z$, in which R' and R" are same or different and represent a $C_1$–$C_8$ alkyl group and Z represents another atom or group, e.g., hydrogen, halo or $C_1$–$C_8$ alkyl.

Additional nitrogen-containing carboxylic acids having utility in the broad practice of the invention include those of the formula:

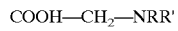

wherein each of R and R' is independently selected from the group consisting of hydrogen, alkyl, aryl, and carboxylic acid.

Carbamate salts and dialkyldithiocarbamates other than those specifically mentioned hereinabove may be used as chelating agents in the broad practice of the invention.

Various other polar organic solvents may be used, e.g., alone or mixed with water.

The formulations of the invention optionally may also include such components as surfactants, stabilizers, corrosion inhibitors, buffering agents, and co-solvents, as useful or desired in a given end use application of formulations of the invention.

The formulations of the present invention are particularly useful on wafers that have been etched with chlorine- or fluorine-containing plasmas followed by oxygen plasma ashing. The residues generated by this type of processing typically contain metal oxides. These residues are often difficult to dissolve completely without causing corrosion of metal features required for effective device performance.

The features and advantages of the invention are more fully shown by the following nonlimiting examples.

EXAMPLE 1

Copper-specific corrosion inhibitors including either nitrogen-containing carboxylic acids or imines were tested in two different types of alkaline cleaning formulations, with the following components and characteristics.

TABLE 1

|  | Components | Temp. | pH | Copper Etch Rate (Å/min) |
|---|---|---|---|---|
| Formulation 1 | Dimethylacetoacetamide, Amine, and Water | 70 | 6.2 | 17.4 |
| Formulation 2 | Ammonium Fluoride, Triethanolamine, Pentamethdiethylenetriamine, and Water | 40 | 8.6 | 7.5 |

The copper etch rate was determined by a standard four-point probe technique. Addition of corrosion inhibitors in accordance with the present invention significantly slowed down the copper etch rate, as shown by the following table, and effectively prevented undesirable corrosion during the cleaning process:

|  | Cu (atoms/cm$^2$) | F (atoms/cm$^2$) | C (atoms/cm$^2$) | Cu$_x$O (Å) |
|---|---|---|---|---|
| Uncleaned Wafer | $1.6 \times 10^{10}$ | $3.3 \times 10^{13}$ | $7.5 \times 10^{13}$ | 42 |
| Cleaned Wafer | $8.5 \times 10^{9}$ | $5.1 \times 10^{13}$ | $1.5 \times 10^{13}$ | 15 |

The foregoing results show that the copper oxide Cu$_x$O has been effectively removed by the cleaning process, while carbon contamination, which is mainly caused by the organic corrosion inhibitors in the cleaning formulation, has been greatly reduced.

While the invention has been described herein with reference to specific features, aspects, and embodiments, it will be appreciated that the invention is not thus limited. The invention therefore may correspondingly embodied in a wide variety of compositions, with corresponding variations of ingredients, and end-use applications. The invention therefore is to be understood as encompassing all such variations, modifications and alternative embodiments, within the spirit and scope of the invention as hereafter claimed.

What is claimed is:

1. A semiconductor wafer cleaning formulation for use in post plasma ashing semiconductor fabrication, comprising the following components in the percentage by weight (based on the total weight of the formulation) ranges shown:

| | |
|---|---|
| organic amine(s) | 2–98% |
| water | 0–50% |
| 1,3-dicarbonyl compound chelating agent | 0.1–60% |
| additional different chelating agent(s) | 0–25% |
| nitrogen-containing carboxylic acid or imine | 0.5–40% |
| polar organic solvent | 2–98% |
| TOTAL | 100%. |

2. The cleaning formulation as described in claim 1 wherein said organic amine(s) comprise a compound selected from the group consisting of:

TABLE 2

| Corrosion Inhibitor | Temp. (° C.) | Formulation Used | Concentration (%) | pH of solution | Copper Etch Rate (Å/min) | Reduction of Etch Rate (%) |
|---|---|---|---|---|---|---|
| Iminodiacetic Acid | 40 | 2 | 1.5 | 8.0 | 1–2 | −73.3~86.7 |
| Glycine | 40 | 2 | 1.5 | 9.2 | 3.6 | −52.0 |
| Nitrilotriacetic Acid | 40 | 2 | 1.5 | 8.2 | 3.6 | −52.0 |
| 1,1,3,3-tetramethylguanidine | 40 | 2 | 1.5 | 8.7 | 3.4 | −54.7 |
| CH$_3$C(=NCH$_2$CH$_2$OH)CH$_2$C(O)N(CH$_3$)$_2$ | 70 | 1 | 24 | 10.9 | 6.2 | −64.4 |
| CH$_3$C(=NCH$_2$CH$_2$OCH$_2$CH$_2$OH)CH$_2$C(O)N(CH$_3$)$_2$ | 70 | 1 | 36 | 10.7 | 0.32 | −98.2 |
| CH$_3$C(=NH)CH$_2$C(O)CH$_3$ | 40 | 2 | 13.68 | 7.9 | 4.4 | −41.3 |

EXAMPLE 2

A contamination test is carried out on formulation 2 containing iminodiacetic acid inhibitor. The semiconductor wafer to be cleaned contained copper and silicon films. After the completion of the cleaning operation, the wafer was rinsed by deionized water at 25° C. for about 15 minutes. The Secondary Ion Mass Spectrometry data (SIMS) obtained are as follows:

| | |
|---|---|
| pentamethyldiethylenetriamine (PMDETA) | 5–95% |
| triethanolamine (TEA) | 5–95%. |

3. The cleaning formulation of claim 1 wherein said 1,3-dicarbonyl compound chelating agent comprises a compound selected from the group consisting of:

| | |
|---|---|
| 2,4-Pentanedione | 2–90% |
| N,N-Dimethylacetoacetamide | 2–90% |
| methyl acetoacetate | 15–70% |
| dimethylmalonate | 10–48.3%. |

4. The cleaning formulation of claim 1 wherein said nitrogen-containing carboxylic acid or imine comprises a compound selected from the group consisting of:

| | |
|---|---|
| iminodiacetic acid (IDA) | 0.5–2.5% |
| glycine | 0.5–2.5% |
| nitrilotriacetic acid (NTA) | 0.5–2.5% |
| 1,1,3,3-tetramethylguanidine (TMG) | 0.5–2.5%. |

5. The cleaning formulation of claim 1 wherein said polar organic solvent comprises a solvent species selected from the group consisting of:

| | |
|---|---|
| ethylene glycol | 0–74% |
| N-methylpyrrolodone (NMP) | 0–49% |
| sulfolane | 0–10% |

6. The cleaning formulation of claim 1 wherein said additional different chelating agent(s) comprise a species selected from the group consisting of:

| | |
|---|---|
| ammonium pyrrolidinedithiocarbamate | 0–25% |
| ammonium carbamate | 0–15% |
| ammonium oxalate | 0–15% |
| ammonium thiocyanate | 0–15% |
| ammonium thiosulfate | 0–15% |
| trifluoroacetic acid | 0–12%. |

7. The cleaning formulation of claim 1 wherein said organic amine(s) comprise a species selected from the group consisting of:
monoethanolamine
diglycolamine
pentamethyldiethylenetriamine (PMDETA)
triethanolamine (TEA)
diazabicyclo (2.2.2) octane
diethylenetriamine
3,3'-iminobis (N,N-dimethylpropylamine)
N-methylimidazole
tetraethylenepentamine
Triethylenetetramine
trimethoxyethoxyethylamine
diethanolamine
methyldiethanolamine
tetramethylhexanediamine
N,N-diethylethanolamine.

8. The cleaning formulation of claim 1 wherein said 1,3-dicarbonyl compound chelating agent comprises a compound selected from the group consisting of:
2,4-pentanedione
methyl acetoacetate
dimethylmalonate
N-methylacetoacetamide
N,N-Dimethylacetoacetamide
acetoacetamide
malonamide.

9. The cleaning formulation of claim 1, wherein said nitrogen-containing carboxyl acid or imine is selected from the group consisting of:
iminodiacetic acid (IDA)
glycine
nitrilotriacetic acid (NTA)
1,1,3,-tetramethylguanidine (TMG)
$CH_3C(=NCH_2CH_2OH)CH_2C(O)N(CH_3)2$
$CH_3C(=NCH_2CH_2OCH_2CH_2OH)CH_2C(O)N(CH_3)_2$
$CH_3C(=NH)CH_2C(O)CH_3$
$(CH_3CH_2)_2NC(=NH)N(CH_3CH_2)_2$
$HOOCCH_2N(CH_3)_2$
$HOOCCH_2N(CH_3)CH_2COOH$.

10. The cleaning formulation of claim 1 wherein said organic amine(s) comprise a compound selected from the group consisting of:
pentamethyldiethylenetriamine (PMDETA) 5–95%
triethanolamine (TEA) 5–95%
said 1,3-dicarbonyl compound chelating agent comprises a compound selected from the group consisting of:

| | |
|---|---|
| 2,4-pentanedione | 2–90% |
| N,N-Dimethylacetoacetamide | 2–90% |
| methyl acetoacetate | 15–70% |
| dimethylmalonate | 0–48.3% | said nitrogen-containing carboxylic acid or imine comprises a compound selected from the group consisting of:

| | |
|---|---|
| iminodiacetic acid (IDA) | 0.5–2.5% |
| glycine | 0.5–2.5% |
| nitrilotriacetic acid (NTA) | 0.5–2.5% |
| 1,1,3,3-tetramethylguanidine (TMG) | 0.5–2.5% | and said polar organic solvent comprises a solvent species selected from the group consisting of:

| | |
|---|---|
| ethylene glycol | 0–74% |
| N-methylpyrrolodone (NMP) | 0–49% |
| sulfolane | 0–10%. |

11. The cleaning formulation of claim 1 comprising a chelating agent having the formula:
X—CHR—Y in which
R is either hydrogen or an aliphatic group and
X and Y are functional groups containing multiply bonded moieties having electron-withdrawing properties.

12. The cleaning formulation of claim 11 wherein each of X and Y is independently selected from $CONH_2$, CONHR', CONR'R", CN, $NO_2$, SOR', and $SO_2Z$ in which R' and R" are alkyl and Z is hydrogen, halo, or alkyl.

13. The cleaning formulation of claim 1, wherein said nitrogen-containing carboxylic acid has the formula:

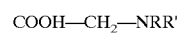

wherein each of R and R' is independently selected from the group consisting of hydrogen, alkyl, aryl, and carboxylic acids.

14. A wafer cleaning formulation, including (i) organic amine(s), (ii) water, (iii) 1,3-dicarbonyl compound chelating agent, (iv) nitrogen-containing carboxylic acid or imine, (v) polar organic solvent, and optionally (vi) additional different chelating agent(s).

* * * * *